United States Patent
Sellers

(12) 
(10) Patent No.: US 7,042,218 B2
(45) Date of Patent: May 9, 2006

(54) SYSTEM AND METHOD FOR REDUCING AUDITORY PERCEPTION OF NOISE ASSOCIATED WITH A MEDICAL IMAGING PROCESS

(75) Inventor: Michael B. Sellers, Florence, SC (US)

(73) Assignee: General Electric Company, Schenectady, NY (US)

( * ) Notice: Subject to any disclaimer, the term of this patent is extended or adjusted under 35 U.S.C. 154(b) by 20 days.

(21) Appl. No.: 10/709,455

(22) Filed: May 6, 2004

(65) Prior Publication Data

US 2005/0248346 A1 Nov. 10, 2005

(51) Int. Cl.
*G01V 3/00* (2006.01)

(52) U.S. Cl. ...................................... 324/309; 324/307

(58) Field of Classification Search ................ 324/307, 324/309, 318, 319, 311, 322, 300; 600/410, 600/438, 442
See application file for complete search history.

(56) References Cited

U.S. PATENT DOCUMENTS

| | | | | |
|---|---|---|---|---|
| 5,033,082 A | * | 7/1991 | Eriksson et al. | ....... 379/406.08 |
| 5,311,453 A | | 5/1994 | Deneberg et al. | |
| 5,313,945 A | * | 5/1994 | Friedlander | ................. 600/410 |
| 5,427,102 A | * | 6/1995 | Shimode et al. | ............ 600/410 |
| 5,552,708 A | * | 9/1996 | Ham | ........................... 324/318 |
| 5,592,085 A | * | 1/1997 | Ehman | ........................ 324/309 |
| 5,606,971 A | * | 3/1997 | Sarvazyan | ................... 600/438 |
| 5,699,480 A | | 12/1997 | Martin | |
| 5,810,731 A | * | 9/1998 | Sarvazyan et al. | .......... 600/438 |
| 5,924,980 A | | 7/1999 | Coetzee | |
| 6,135,952 A | | 10/2000 | Coetzee | |
| 6,236,862 B1 | | 5/2001 | Erten et al. | |
| 6,463,316 B1 | | 10/2002 | Brungart | |
| 6,482,160 B1 | | 11/2002 | Stergiopoulos et al. | |

(Continued)

FOREIGN PATENT DOCUMENTS

DE 103 56 046 A1 * 9/2004

OTHER PUBLICATIONS

Croft, J. et al., "Theory, History, and the Advancement of Parametric Loudspeakers: A Technology Overview"; 2001, American Technology Corporation, pp. 1-27.

(Continued)

*Primary Examiner*—Brij B. Shrivastav
(74) *Attorney, Agent, or Firm*—Ziolkowski Patent Solutions Group, SC; Michael A. Della Penna; Carl B. Horton

(57) ABSTRACT

A system and method for acoustic noise reduction/cancellation is disclosed that includes a medical imaging scanner configured to scan an imaging subject within an imaging area that emits system noise when in operation. An ultrasonic emitter system is included that is constructed to emit an inaudible signal having properties to reduce perception of the system noise about at least a portion of the imaging area.

31 Claims, 3 Drawing Sheets

U.S. PATENT DOCUMENTS 6,486,669 B1 * 11/2002 Sinkus et al. ............... 324/307
6,522,688 B1    2/2003 Dowling
6,597,732 B1    7/2003 Dowling
6,875,176 B1 *  4/2005 Mourad et al. ............. 600/442

OTHER PUBLICATIONS

"Technology Licensing—HyperSonic Sound"; 2001, American Technology Corporation, pp. 1-3, http://www.atcsd.com/tl_hss.html.

"Frequently Asked Questions and Answers, Revision E"; 2001, American Technology Corporation, pp. 1-13.

"Technolgoy Intruduction: How HSS can shape the future of sound"; 2001, American Technology Corporation, pp. 1-16.

"HSS Directed Audio Sound System: Owner's Manual & Installation Guide: Model S220A"; 2002, American Technology Corporation, pp. 1-16.

"HSS Directed Audio Sound System: Model 220"; 2002, American Technology Corporation, pp. 1-4.

* cited by examiner

SYSTEM AND METHOD FOR REDUCING AUDITORY PERCEPTION OF NOISE ASSOCIATED WITH A MEDICAL IMAGING PROCESS

BACKGROUND OF INVENTION

The present invention relates generally to medical imaging devices, and more particularly, to a system and method using a parametric signal generator to reduce perceivable noise generated during operation of a medical imaging device.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization," $M_z$, may be rotated, or "tipped," into the x-y plane to produce a net transverse magnetic moment $M_t$. A signal is emitted by the excited spins after the excitation signal $B_1$ is terminated. This signal may be received and processed to form an image by application of a combination of linear gradient fields (Bx, By and Bz) as produced by the gradient coils. These fields cause the individual spins in the human tissue to precess at different frequencies (Larmor relationship) and these differences can be used to encode the raw data to provide real images.

As current is introduced to the gradient coils, such as to produce the Bx, By or Bz fields, an acoustic noise is created by Lorentz forces. This noise can be rather loud and might be described to those not skilled in the art as akin to beating of an empty drum with a hammer. While the production of noise in this manner does not directly affect the medical imaging process, the noise may be uncomfortable or disconcerting to an imaging subject. Accordingly, "noise cancellation" devices have been developed in an attempt to reduce the imaging subject's perception of the noise and thereby present a more comfortable environment for the subject during the imaging process. However, prior noise cancellation devices and methods have not met general acceptance for a number of reasons.

For example, attempts to utilize conventional sound production devices such as loud speakers to produce acoustic noise canceling signals designed to reduce an imaging subject's perception of noise have been largely unsuccessful for various reasons. First, conventional loud speakers become ineffective when subjected to strong magnetic fields such as those produced by the imaging process. That is, the magnetic field generated during the imaging process interacts with the voice coils in the loud speaker and interferes with proper emission of the desired noise canceling signal from the loud speaker. Second, conventional loud speakers emit audible signals that can be difficult to control as the audio signal disperses peripherally during propagation. As such, by removing the loud speakers from close proximity to the imaging device in an attempt to lessen the effects of the magnetic field produced by the imaging device, the audio may "bleedthrough" to undesired areas and may actually create more unwanted noise. Therefore, while extending the distance between the loudspeaker system and the imaging device lowers the effects of the field, the extended distance causes the noise reducing signal to further dissipate and disperse into unwanted areas.

Additionally, attempts have been made to construct noise reducing systems utilizing pneumatically driven or air driven signals, such as those found in commercial airline applications. These systems are advantageous because they can provide a highly directional signal to an area without the use of conductive materials that can be adversely affected by the magnetic field generated during imaging. However, pneumatically driven systems typically do not deliver signals accurately enough to sufficiently reduce noise generated by the imaging process. Therefore, while a headset may be made of plastic, glass, or some other non-conductive material such that signal delivery is highly directed and is unimpaired by magnetic fields, the accuracy of the signal delivered is insufficient to serve as a suitable noise canceling means.

Alternate audio producing systems such as piezoelectric speakers have also been found to be unsuitable for such noise canceling application due to inherent limitations at low frequency ranges. As such, though piezoelectric speakers are not impeded by the magnetic fields associated with medical imaging, suitable noise cancellation fails at the necessary low frequencies generated by the Lorentz forces on the gradient coils. Therefore, the low frequencies produced as a byproduct of the imaging process are unaffected and remain perceivable by the imaging subject.

It would therefore be desirable to have a system and method capable of generating suitable noise cancellation signals to reduce the perceived noise associated with medical imaging processes such as MR imaging. Furthermore, it would be advantageous to have a system and method capable of directionally controlling the emission of a noise cancellation signal to avoid unnecessary propagation of noise cancellation signals into undesired areas. Also, it would be desired that such a system and method be capable of generating the necessary noise reducing signal without substantial operational impairment by the magnetic field.

BRIEF DESCRIPTION OF INVENTION

The present invention provides a system and method of reducing the perception of noise generated as a byproduct of a medical imaging process through acoustic noise cancellation. The inaudible signal is generated by a parametric signal generator and is emitted and directed to a selected area wherein the perceivable noise within the area is significantly reduced.

In accordance with one aspect of the invention, a medical imaging scanner system is disclosed that is configured to scan an imaging subject within an imaging area that emits system noise when in operation. The medical imaging scanner system includes an emitter system constructed to emit an inaudible signal having properties to reduce perception of the system noise about at least a portion of the imaging area.

In accordance with another aspect of the invention, a method of medical imaging is disclosed that includes performing a medical imaging process upon an imaging subject. This medical imaging process typically produces an undesirable noise byproduct. The method of medical imaging includes emitting an audible signal configured to diminish auditory perception of the noise byproduct.

In accordance with yet another aspect of the invention, an MRI apparatus including an MRI system is disclosed that includes a plurality of gradient coils positioned about a bore of polarizing magnet to impress a polarizing magnetic field. The MRI system also includes an RF transceiver system and an RF switch controlled by a pulse module to transmit RF signal to an RF coil assembly to acquire MR images. The MRI apparatus further includes a parametric signal generator configured to generate ultrasonic signals to reduce perception of noise produced by the MRI system during operation.

Various other features, objects, and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

A system and method is disclosed to reduce perception of noise produced as a byproduct of an imaging process using a directional inaudible signal. An emitter is used to emit an inaudible signal that has properties designed to reduce noise produced by an imaging system about at least a portion of an imaging subject.

Figure 1:
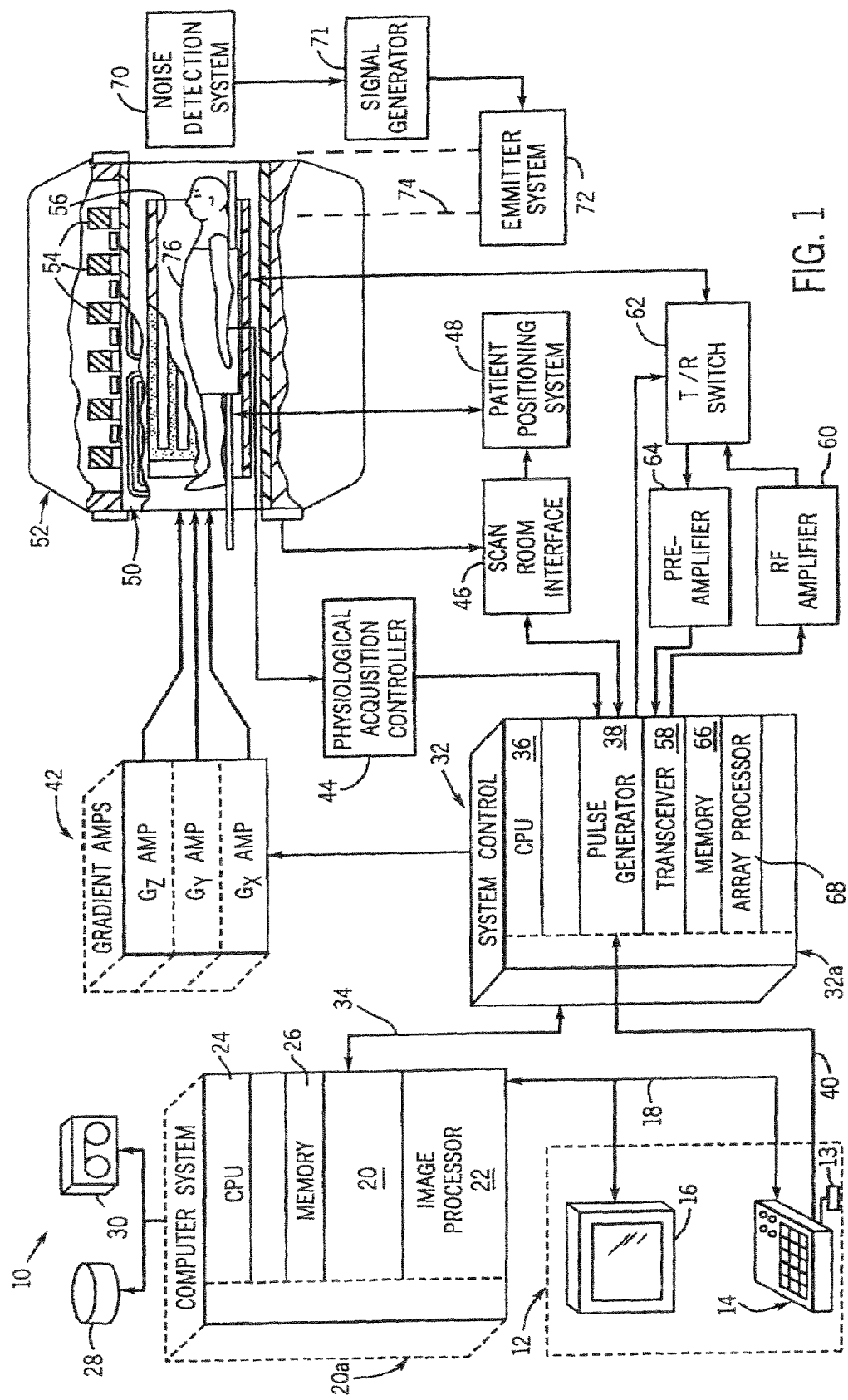
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The MRI system 10 also has a noise detection device 70, signal generator 71, and emitter system 72. The noise detection device 70 is configured to monitor the MRI system 10 during operation and detect certain noise associated with the operation. The noise detection device 70 sends feedback regarding detected noise to a signal generator 71. The signal generator 71 reviews the feedback from the noise detector device 70 and determines the properties of a signal necessary to reduce auditory perception of the detected noise. The signal generator 71 generates a signal with properties to reduce perception of the system noise created as a byproduct of an imaging process. The signal generator 71 sends the generated signal to an emitter system 72 for processing and emission.

The signal generator 71 and the emitter system 72 together function as a paramagnetic signal generator. That is, as will be described in greater detail with respect to FIG. 2, the emitter system 72 receives the signal produced by the signal generator 71. Using this signal, the emitter system 72 creates an ultrasonic signal with a frequency preferably greater than approximately 2 kHz that when introduced to a non-linear medium, such as air, is converted from a set of ultrasonic frequencies to an audible signal designed to reduce auditory perception of the imaging system 10 noise.

The emitter system 72 is designed to emit the inaudible signal as a column to produce anti-noise or noise canceling signals that reduce the auditory noise perceived by an imaging subject 76. The inaudible signal 74 is designed to be demodulated by a non-linear medium. Therefore, when the inaudible signal 24 is emitted from the emitter system 72, the signal is demodulated by an interaction with environmental air, which has non-linear properties. The demodulation produces audible tones in a highly directional column that may be directed at the imaging subject 76 to at least partially cancel noise produced by the operation of MRI system 10.

It is contemplated that the emitter system 72 and/or components thereof may be positioned within the magnetic field generated by the coils 50 or may be positioned outside the field. In a preferred embodiment, the emitter system includes a HyperSonic®Sound (HSS®) emitter, as available in American Technology Corporation's R220A system, to generate the inaudible signal. The emitter is based on piezoelectric technology which is not subject to the low frequency limitations described earlier since it is used to create ultrasonic frequency signals. HyperSonic® Sound and HSS® are registered trademarks of American Technology Corporation, 12725 Stowe Drive Poway, Calif. 92064. The HSS® emitter may be positioned removed from, but in proximity to, the coils 50 to emit the inaudible signal at the imaging subject 76.

Figure 2:
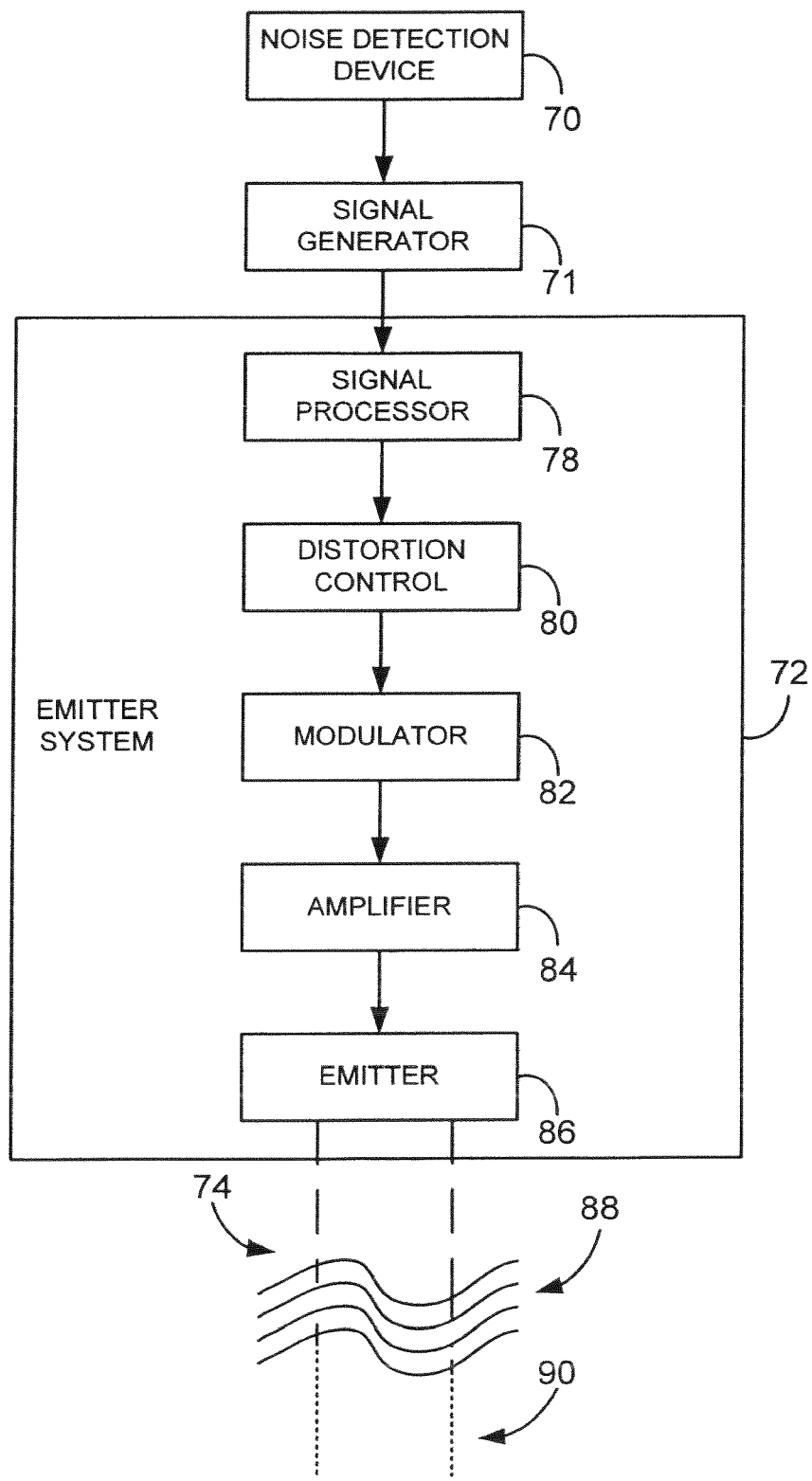
FIG. 2 is a block diagram of a directional noise perception reduction system for use with the MR imaging system of FIG. 1.

FIG. 2 illustrates an embodiment of the noise detection device 70, signal generator 71, and emitter system 72 that together deliver a highly directional inaudible signal designed to reduce perceivable noise generated during an imaging process. The emitter system 72, in accordance with a preferred embodiment, includes a signal processor 78, a distortion control 80, a modulator 82, an amplifier 84, and an emitter 86.

In response to feedback from the noise detection device 70, indicating that noise is currently or is about to be generated as a byproduct of an imaging process, the signal generator 71 generates a signal with properties specifically designed to reduce the noise detected by the noise detection device 70. The signal frequency generated is dependent upon the noise produced as a byproduct of an imaging process and the feedback received regarding such noise.

It is contemplated that prior to any noise generation from the MR system, a look-up table may be utilized, whereby the characteristics of a selected imaging sequence are used to look up information from the look-up table regarding noise characteristics of the selected imaging sequence. The characteristics of the noise byproduct produced are directly related to the pulse sequence used in specific imaging process and will vary substantially according to the scan selected. Therefore, the selected imaging process may be utilized to predict the noise characteristics that will be associated therewith and predictively determine the signal characteristics necessary to reduce the perceivable noise produced as a byproduct of the selected imaging process.

Additionally or alternatively, once the imaging process has begun and noise byproduct is being generated, the signal generator 71 analyzes the noise detected. By analyzing the noise detected by the noise detection system 70, the signal generator 71 dynamically determines the characteristics of a signal necessary to reduce perception of the noise byproduct. It is contemplated that the signal generator 71 continue the analysis over the duration of the imaging process to dynamically adjust to changes in the noise byproduct to reduce auditory perception of the noise byproduct regardless of variations in the noise characteristics.

Once the signal generator 71 determines the necessary signal, the signal is passed to the emitter system 72. Upon reaching the emitter system 72, the signal is passed through a signal processor 78, distortion control 80, and a modulator 82 to form a composite inaudible or ultrasonic waveform. Specifically, the signal processor 78 receives the signal generated by the signal generator 71 and generates an ultrasonic frequency signal, which is modulated by the modulator 82 with a second signal that may or may not be ultrasonic to create a composite ultrasonic waveform. The composite ultrasonic waveform is provided to the amplifier 84 to generate an amplified composite ultrasonic waveform that is passed to the emitter 86. The amplified composite ultrasonic waveform is output from emitter 86 as a highly directional inaudible signal column 74. That is, the emitted inaudible signal 74 forms a virtual column directly in front of emitter 86.

Upon impinging a non-linear medium 88, such as atmospheric air, the inaudible signal 74 interacts with the air. The non-linearity of the air 88 demodulates the inaudible signal 74 generating canceling audible sounds 90. These audible sounds 90 are generated due to properties of the non-linear medium, i.e. air, though which the column of inaudible signal 74 passes. Specifically, the non-linear medium "down converts" the inaudible signal 74 to a lower audible frequency spectrum, thereby converting the inaudible signal column 74 to an audible signal column 90.

Therefore, in response to noise feedback, the signal generator 71 generates a signal designed to reduce perceived noise produced as a byproduct of an imaging process. The signal passes through a signal processor 78, a distortion control 80, and a modulator 82 to produce a composite ultrasonic waveform. The composite ultrasonic waveform passes to an amplifier 84 before being passed from an emitter 86. As the emitted inaudible signal 74 passes through a non-linear medium 88, such as air, the signal 74 is demodulated by an interaction with the non-linear medium 88 to produce audible tones 90 that are designed to at least reduce an imaging subject's perception of noise produced as a byproduct of an imaging process. The ultrasonic signal 74 and ultimately the audible signal 90 travel as highly directional signals that may be controlled as a column to be directed toward an imaging subject and/or any other target without significant signal dispersion and associated bleedthrough.

Figure 3:
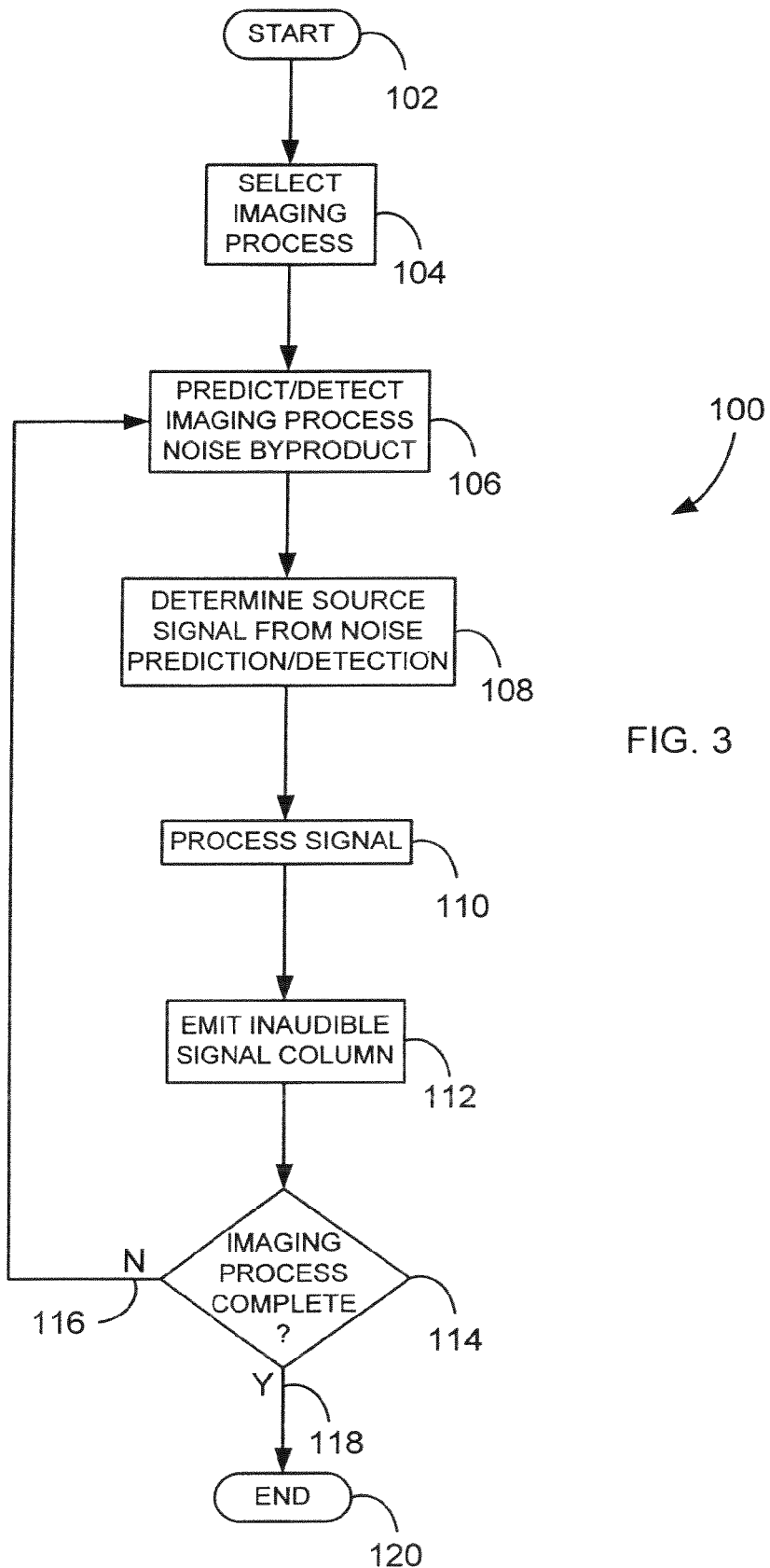
FIG. 3 is a flow chart showing the steps of a noise perception reduction technique in accordance with one embodiment of the present invention.

Referring now to FIG. 3, a flowchart 100 is shown illustrating the steps of a technique for reducing the noise perceived by an imaging subject during an imaging process. The technique starts 100 upon initiation or selection of a desired imaging process 104. Once the desired imaging process is selected 104, the noise generated as a byproduct of the imaging process is predicted and/or detected, as described with respect to FIG. 2. That is, as previously described, a look-up table may be utilized to predict the noise that will be produced by the imaging process and then the noise generated as a byproduct of the initiated imaging process may be continuously detected to dynamically generate a noise reducing signal during the imaging process 106.

The noise prediction/detection 106 is used to determine the specific signal to generate so as to include properties selected to ultimately reduce the noise byproduct perceived by the imaging subject 108. The selected signal 108 is then processed, as described with respect to FIG. 2, and emitted as an inaudible signal column 112.

To assure that changes in the noise byproduct do not deviate from the predicted/detected noise 106, a check is made to determine whether the imaging process is complete 114. If the process is not yet complete 116, the system again determines the noise byproduct produced by the imaging process 106 to continually determine and adjust the source signal in response to changes in the generated system noise. As such, the system dynamically adjusts to changes in the characteristics of the noise byproduct to assure that the noise perceived by the imaging subject is sufficiently reduced. On the other hand, once the imaging process is complete 116, the technique ends 120 and signal emissions cease.

Therefore, the above-described system and method generates a highly directionally controlled signal that is designed to reduce noise perceived by an imaging subject during an imaging process. The signals produced are dynamically generated and emitted as an ultrasonic signal that, upon interaction with air, generates an audible signal that reduces noise perceived by an imaging subject across a varying spectrum of noise. Additionally, the above-described system is designed such that the signals generated and the system for emitting the signals are unimpeded by strong magnetic fields that may be associated with the imaging process. It is contemplated that while the present invention is particularly applicable in an MR imaging system, the system performing the imaging process may also include an ultrasound imaging system, an x-ray imaging system, a computed tomography (CT) imaging system, an electron beam tomography system, a positron emission tomography system, a single photon emission computed tomography system, or any other imaging system that may benefit from noise reduction.

Therefore, the present invention provides a system and method of reducing perceivable noise generated as a byproduct of a medical imaging process through acoustic noise cancellation. A parametric signal generator is used to generate an inaudible signal that has properties designed to reduce noise produced by an imaging system about at least a portion of an imaging subject.

In accordance with one embodiment of the invention, a medical imaging scanner system is configured to scan an imaging subject within an imaging area. The medical imaging scanner emits system noise when in operation. The medical imaging scanner system also includes an emitter system constructed to emit an inaudible signal having properties to reduce perception of the system noise about at least a portion of the imaging area.

Another embodiment of the invention includes a method of medical imaging. The method includes performing a medical imaging process upon an imaging subject, wherein the medical imaging process produces a noise byproduct. The method of medical imaging includes emitting an audible signal configured to diminish auditory perception of the noise byproduct.

In a further embodiment of the invention, an MRI apparatus includes an MRI system having a plurality of gradient coils positioned about a bore of polarizing magnet to impress a polarizing magnetic field. The MRI system also has an RF transceiver system and an RF switch controlled by a pulse module to transmit RF signal to an RF coil assembly to acquire MR images. Also, the MRI apparatus includes a parametric signal generator configured to generate ultrasonic signals to reduce perception of noise produced by the MRI system during operation.

The present invention has been described in terms of the preferred embodiment, and it is recognized that equivalents, alternatives, and modifications, aside from those expressly stated, are possible and within the scope of the appending claims.

The invention claimed is:

1. A medical imaging scanner system comprising:
a medical imaging scanner configured to scan an imaging subject within an imaging area, wherein the medical imaging scanner emits system noise when in operation; and
an emitter system constructed to emit an inaudible signal having properties to reduce auditory perception of the system noise about at least a portion of the imaging area.

2. The medical imaging scanner system of claim 1 further comprising a parametric sound generator configured to generate a signal having properties to reduce perception of the system noise.

3. The medical imaging scanner system of claim 1 wherein the medical imaging scanner is a magnetic resonance image scanner and the emitter system is arranged outside of a magnetic field of the magnetic resonance image scanner.

4. The medical imaging scanner system of claim 1 wherein the emitter system includes an ultrasonic emitter capable of columnular emissions.

5. The medical imaging scanner system of claim 4 wherein the ultrasonic emitter is mounted external to the medical imaging scanner.

6. The medical imaging scanner system of claim 4 wherein the ultrasonic emitter is arranged such that the columnular emissions are directed at a location to provide an imaging subject with a substantially noise free environment.

7. The medical imaging scanner system of claim 1 wherein at least a portion of the emitter system is arranged a distance from the imaging area.

8. The medical imaging scanner system of claim 1 wherein the emitter system is directed toward at least one of the imaging subject area and an operator area.

9. The medical imaging scanner system of claim 1 further comprising another emitter system constructed to reduce perception of system noise about at least a portion of an operator area.

10. The medical imaging scanner system of claim 1 wherein the emitter system is configured to directionally emit the inaudible signal.

11. The medical imaging scanner of claim 1 wherein the system noise reduction occurs near an imaging subject's ears.

12. The medical imaging scanner system of claim 1 wherein the emitter system includes an emitter that produces a column of ultrasonic energy in front of the emitter that contains properties to produce cancellation audio frequencies when intermixed with a non-linear medium.

13. The medical imaging scanner system of claim 12 wherein the non-linear medium includes atmospheric air.

14. The medical imaging scanner system of claim 12 wherein the cancellation audio frequencies are demodulated along the column of ultrasonic energy.

15. The medical imaging scanner system of claim 14 wherein the demodulated cancellation audio frequencies interact with the system noise to reduce perceivable system noise at the imaging area.

16. The medical imaging scanner system of claim 15 wherein the imaging area is an area of imaging subject sound reception.

17. The medical imaging scanner system of claim 1 wherein the system noise is reduced as perceived by an imaging subject during a scanning operation.

18. A method of medical imaging comprising:
performing a medical imaging process upon an imaging subject, wherein the medical imaging process produces a noise byproduct; and
emitting an inaudible signal configured to diminish auditory perception of the noise byproduct.

19. The method of claim 18 further comprising performing the medical imaging process on an imaging volume and emitting the inaudible signal outside of the imaging volume.

20. The method of claim 18 further comprising columnly emitting the inaudible signal to diminish auditory perception of the noise byproduct within a selected volume.

21. The method of claim 20 wherein the selected volume includes one of an imaging volume and an operating volume.

22. The method of claim 18 further comprising producing a column of ultrasonic energy configured to interact with atmospheric air to produce anti-noise audio frequencies when intermixed with an environmental air.

23. The method of claim 18 wherein the medical imaging process includes a magnetic imaging resonance imaging process.

24. An MRI apparatus comprising:
an MRI system having a plurality of gradient coils positioned about a bore of a polarizing magnet to impress a polarizing magnetic field, and an RF transceiver system and an RF switch controlled by a pulse module to transmit RF signals to an RF coil assembly to acquire MR images; and
a parametric signal generator configured to generate ultrasonic signals to reduce auditory perception of noise produced by the MRI system during operation.

25. The MRI apparatus of claim 24 wherein the ultrasonic signals are configured to induce anti-noise signals upon interaction with environmental air.

26. The MRI apparatus of claim 25 wherein the anti-noise signals are contained within a propagation column.

27. The MRI apparatus of claim 26 wherein the propagation column is focused on at least one of an operator area and the bore of the polarizing magnet.

28. The MRI apparatus of claim 24 wherein the ultrasonic signals contain modulated ultrasonic audio frequencies configured to generate demodulated cancellation audio frequencies upon interacting with a nonlinear medium.

29. The MRI apparatus of claim 28 wherein the demodulated cancellation audio frequencies interact with noise produced by the MRI system to reduce perception of the noise.

30. The MRI apparatus of claim 24 wherein the parametric signal generator is disposed remotely from the MRI system.

31. The MRI apparatus of claim 24 further comprising an emitter configured to deliver an ultrasonic signal to at least a portion of the MRI system.

* * * * *